United States Patent
Gabillard et al.

(10) Patent No.: US 6,914,479 B1
(45) Date of Patent: Jul. 5, 2005

(54) DIFFERENTIAL AMPLIFIER WITH DC OFFSET CANCELLATION

(75) Inventors: Bertrand Gabillard, Paris (FR); Michel Rivier, Barbizon (FR); Fabrice Voisin, La Courneuve (FR); Philippe Girard, Corbeil Essonnes (FR)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 10/604,479

(22) Filed: Jul. 24, 2003

(30) Foreign Application Priority Data

Jul. 26, 2002 (EP) ............................................ 02368081

(51) Int. Cl.[7] ................................................ H03F 3/45
(52) U.S. Cl. ........................ 330/69; 330/252; 330/260
(58) Field of Search .......................... 330/69, 85, 252, 330/260, 291; 327/307

(56) References Cited

U.S. PATENT DOCUMENTS

| 5,838,197 A | * 11/1998 | Tsukuda ...................... 330/252 |
| 6,313,704 B1 | * 11/2001 | Maruyama et al. .......... 327/307 |
| 6,466,090 B1 | * 10/2002 | Giuroiu ........................ 330/69 |

OTHER PUBLICATIONS

622Mb/s CMOS limiting amplifier with 40 dB dynamic range by T. Yoon & B.Jalali, published in Electronics Letters, Sep. 26, 1996, vol. 32, No. 20, pp. 1920–1921.

* cited by examiner

Primary Examiner—Khanh V. Nguyen
(74) Attorney, Agent, or Firm—Lisa J. Ulrich

(57) ABSTRACT

There is disclosed an improved differential amplifier (20) having a feedback loop that generates an amplified output signal (Vout) from an input signal (Vin) supplied by a preceding stage. It comprises an input matching circuit (11) connected to said preceding stage, a buffer (22) and an amplification section (12) connected in series in the direct amplification line, a first amplifier (16), a RC network (17') and a second amplifier (23) connected in series in a parallel loop between the outputs and the inputs of the amplification section that generate the feedback signal. The role of said buffer and second amplifier associated in a dedicated direct and feedback signal combining block (21) is to respectively isolate the input signal and the feedback signal from the summing nodes (A',B') at the amplification section inputs. As a result, the summation of the input signal and the feedback signal is improved, the DC component of the output signal is filtered out in order to significantly reduce the DC offset. In addition, the input impedance matching represented by parameter $S_{11}$ is considerably improved.

4 Claims, 2 Drawing Sheets

DIFFERENTIAL AMPLIFIER WITH DC OFFSET CANCELLATION

BACKGROUND OF INVENTION

The present invention relates to large bandwidth high frequency amplifiers to be placed in the receiver section of a high speed transmission system and more particularly to an improved differential amplifier provided with a parallel feedback loop to amplify high frequency signals wherein the DC offset is significantly reduced and the input impedance matching improved.

In the receiving part of high speed wired transmission systems (like Ethernet), there is a need for the amplification of high frequency low power signals. This is achieved with a dedicated differential amplifier basically consisting of a chain of low gain large bandwidth amplifiers with a parallel feedback loop, usually called post-amplifier or PA, that is placed after the optical circuitry (photodiode and associated transimpedance circuit) of the receiving section.

The block diagram of such a conventional amplifier is shown in FIG. 1. Now turning to FIG. 1, the conventional differential amplifier referenced 10 is comprised of an input matching circuit 11, an amplification section 12 consisting of a chain of large bandwidth amplifiers to obtain enough gain in the frequencies of interest (in the GHz range) and finally a circuit block 13 in the DC feedback loop connected in parallel between the inputs and outputs of said amplification section 12. All these circuit components are mounted in a differential manner. As apparent in FIG. 1, input matching circuit 11 consists of a single resistor for the sake of simplicity, that is mounted in parallel between two input terminals 14 and 15 receiving single-ended input signals INp and INn respectively from a preceding stage schematically represented by a voltage supply Vin and a resistor R. Vin will be referred to hereinbelow as the input voltage for the sake of simplicity. Corresponding single-ended output signals OUTp and OUTn are available at output terminals 18 and 19 respectively, and likewise define the output signal Vout, such as Vout=$V_{OUTp}-V_{OUTn}$. Feedback block 13 includes an amplifier 16 (for further amplification of the output signal Vout) and a RC network 17 comprised of blocks 17' for low pass filtering and 17" to perform the summation of the direct input and feedback signals at nodes A and B at the inputs of the first amplifier of amplification section 12 as shown in the drawing. The dotting which is made at nodes A and B allows the desired reduction of the DC offset by the single-ended feedback signals Fbn and Fbp. As known for the skilled professional, the voltage V at the inputs of the amplification section 12 is a function of Vin and Vfb, where Vfb=$V_{FBp}-V_{FBn}$. Note that a quite similar circuit is described in the article: "622 Mb/s CMOS limiting amplifier with 40 dB dynamic range" by T. Yoon & B. Jalali, published in Electronics Letters, Sep. 26, 1999, Vol. 32 No 20, pp 1920–1921.

The conventional differential amplifier shown in FIG. 1 only partially reduces the DC offset, because, unfortunately, it amplifies not only the useful input signal but also any DC offset signal, coming from the previous circuits or internally generated at the input terminals of amplifier 10. The amplitude of this DC offset signal can be of the same order of magnitude or even greater than the one of the input signal itself and then can detrimentally saturate the differential output signal Vout with invalid information. In addition, the feedback block 13, which connect the RC network 17 in parallel on the input matching circuit 11 significantly degrades the input impedance matching, referred to as the scattering parameter $S_{11}$ in the technical literature.

SUMMARY OF INVENTION

According to the present invention there is described a solution to this problem, consisting of an improved large bandwidth high frequency amplifier wherein the DC offset in the output signal is significantly reduced. This is performed by separating the useful high frequency input signal information from the DC offset signal. To that end, a direct and feedback signal combining block is inserted that bridges the direct amplification line and the feedback loop at the summing nodes. As a result, the filtering of the AC components of the output signal that is combined with the input signal is improved. In essence, the direct and feedback signal combining block is comprised of two circuits. A first circuit, typically a buffer or an unitary gain differential amplifier is inserted between the input matching circuit and the amplification section to isolate the input signal from the summing nodes. A second circuit, consisting of a differential amplifier connected to the summing nodes, is inserted in the feedback loop to isolate the feedback block from said nodes and amplifies the feedback signal $V_{fb}$ if necessary. The role of these two circuits is to modify the signal combination at the summing nodes.

In addition to this DC offset signal reduction, the improved amplifier of the present invention offers other outstanding advantages. Because, there the feedback signal does not interfere with the input signal, an excellent input impedance matching is obtained, i.e. the scattering parameter $S_{11}$ is negative and close to infinite. This is mandatory in high speed systems to achieve a low eye-diagram closure or good jitter (and bit error rate) performance. The efficiency of offset reduction can be adjusted and is independent of input signal amplification. The loop stability is ensured by construction. Finally, all elements can be integrated in a chip using conventional integrated circuit technologies, saving board space, element count and cost.

It is therefore a primary object of the present invention to provide an improved large bandwidth high frequency differential amplifier having a feedback loop that allows to significantly reduce the DC offset.

It is another object of the present invention to provide an improved large bandwidth high frequency differential amplifier having a feedback loop wherein the feedback signal does not interfere with the input signal improving thereby the input impedance matching (represented by the $S_{11}$ parameter).

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DETAILED DESCRIPTION

Figure 1:
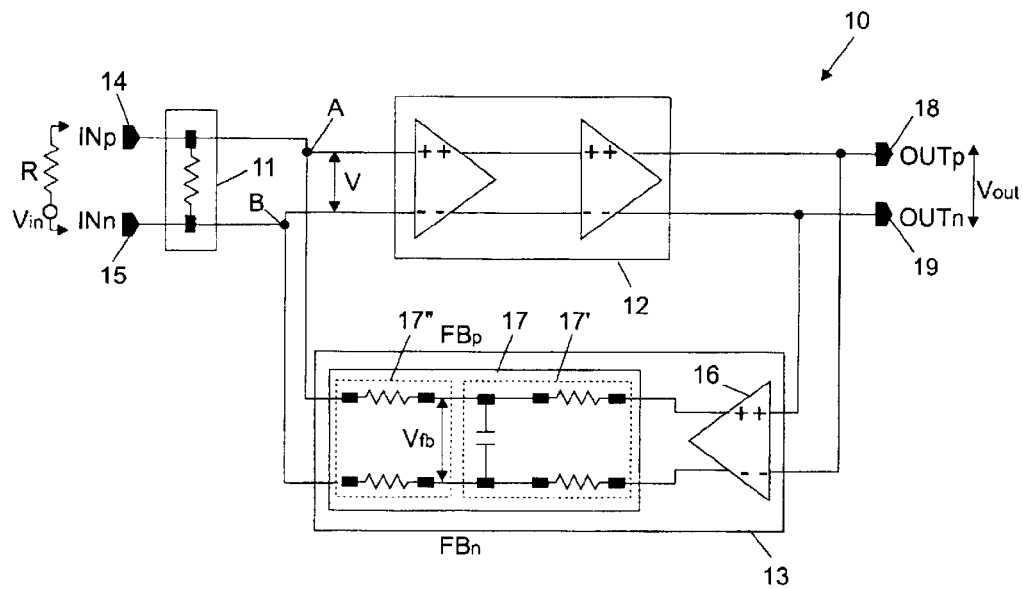
FIG. 1 shows a conventional large bandwidth high frequency differential amplifier circuit designed with a parallel feedback loop.

Like reference numerals (with prime) are used through the several drawings to designate identical (corresponding) parts.

Figure 2:
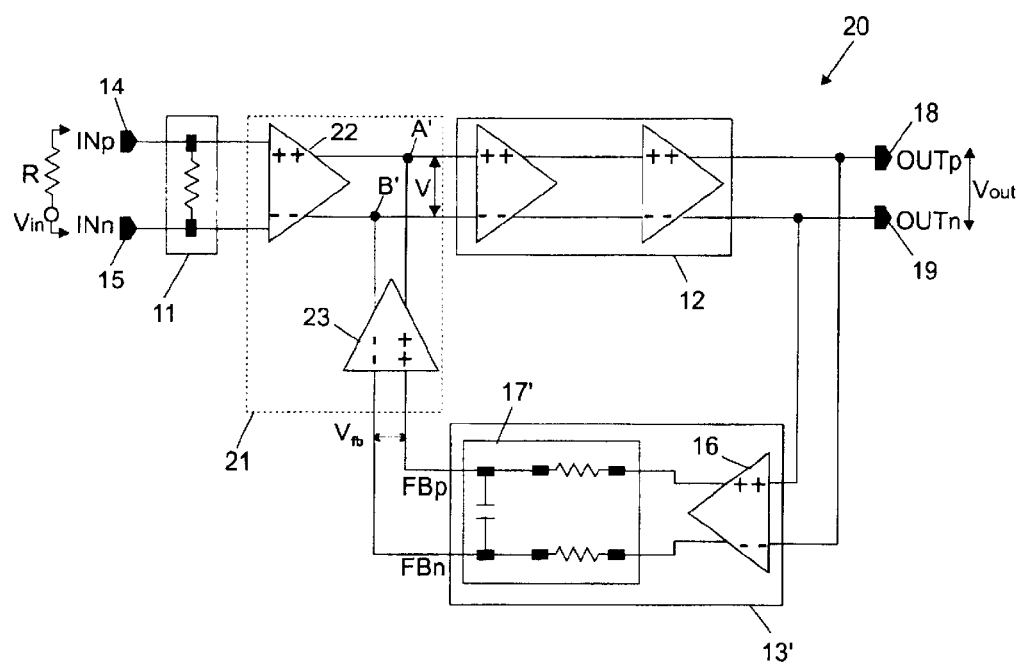
FIG. 2 shows the improved large bandwidth high frequency amplifier basically deriving from the FIG. 1 circuit but provided with an innovative input and feedback signal combining block according to the present invention.

The improved large bandwidth high frequency amplifier of the present invention is shown in FIG. 2 where its bears numeral 20. In essence, it differs from the conventional FIG. 1 amplifier 10 by the input and feedback signal combining block that bridges both the direct amplification line and the feedback loop, while the other elements remain substantially identical. Now turning to FIG. 2, the signal and feedback signal combining block referenced 21 is comprised of a circuit 22, typically a buffer or an unitary gain amplifier (as shown in the drawing), placed between the input matching circuit 11 and the amplification section 12 on the one hand, and of a differential amplifier 23 connected in series with the feedback block now referenced 13' because the RC network 17 shown in FIG. 1, can be simplified in some extent (the resistors composing sub-network 17" are no longer necessary). Signals Fbp and Fbn output by feedback block 13' can be amplified in amplifier 23 if necessary, then applied to the summation nodes, now referenced A' and B', respectively. The main role of circuits 22 and 23 is thus to isolate the input signal Vin and the feedback signal Vfb from these summing nodes. In addition, circuit 23 can be used to amplify the feedback signal Vfb.

The relationship between signals at the inputs of the amplification section 12 is substantially the same but circuits 22 and 23 which respectively isolate summing nodes A' and B''' from input signal Vin and feedback signal Vfb at the inputs of the amplification section 12, totally avoid any degradation of the input impedance matching. As a consequence, circuit 22 can accommodate any type of matching circuit 11 since there is no more direct connection with the feedback block 13' elements. The response of the feedback loop can also be better controlled and has a full efficiency, whereas in the conventional solution, the matching circuit 11 degrades the gain of the feedback loop and thus its efficiency.

Figure 3:
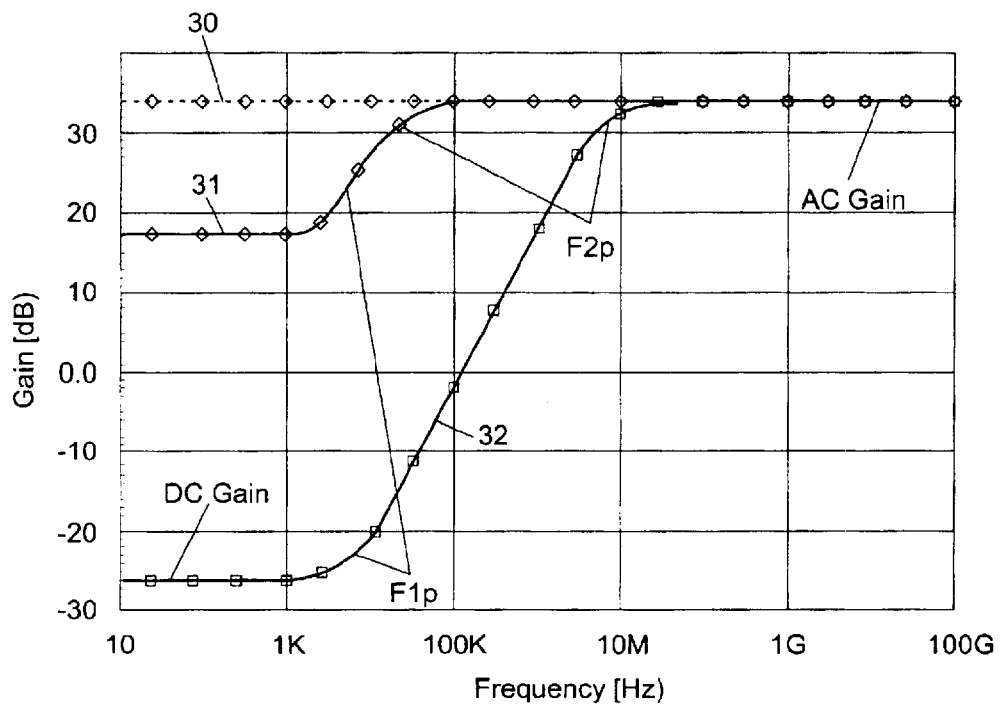
FIG. 3 shows the small signal frequency responses of the FIG. 1 and FIG. 2 amplifier circuits 10 and 20 with and without feedback.

The small signal frequency responses of the conventional and improved amplifiers 10 and 20 are shown in FIG. 3. Curve 30 represents the response of both amplifiers 10 and 20 when there is no feedback loop. Curve 31 represents the response of amplifier 10 which clearly shows that only a partial offset compensation is obtained. Curve 32 represents the response of amplifier 20 when the combining block 21 is implemented. As apparent in FIG. 3, the low frequency response is modified. The DC gain is substantially different from the AC gain (high frequency gain). The two poles F1p and F2p which define the DC and AC gain regions need to be spaced as much as possible, so that the DC gain becomes negative, reducing thereby the DC offset. Curve 32 demonstrates that this highly desirable result is obtained with amplifier 20 implementing the present invention.

Typical DC/AC characteristics of the conventional and improved amplifiers 10 and 20 for identical direct line and feedback loop gain, 100 and 10 respectively, and for identical RC networks are given in Table 1 below.

TABLE 1

DC/AC Comparison

| Circuit | DC Gain [dB] | AC Gain [dB] | F1p [Hz] | F2p [Hz] |
|---|---|---|---|---|
| Conventional | 18.8 | 33.8 | 5.79 k | 30.9 k |
| Improved | −26.0 | 34.0 | 5.64 k | 5.64 M |

The better efficiency that is obtained with the improved amplifier circuit 20 of the present invention is emphasized by the negative value of the DC gain that stays positive with the conventional amplifier 10 which only achieves a partial compensation of the input offset as mentioned above.

Table 2 below allows an easy comparison of the figures of the $S_{11}$ parameter of that are obtained by simulations (assuming ideal block components are used) for the conventional and improved amplifier circuit 10 and 20.

TABLE 2

$S_{11}$ Comparison

| Design | $S_{11}$ @ 10 Hz [dB] | $S_{11}$ @ 1 GHz [dB] |
|---|---|---|
| Conventional | −1.7 | −40.0 |
| Improved | −inf. | −inf. |

The figures of the $S_{11}$ parameter of improved amplifier circuit 20 are quite excellent (close to a negative infinite value in dB). It does not suffer from the degradation due to the RC network 17' thanks to the combined isolation provided by both circuits 22 and 23 at low frequencies.

Figure 4:
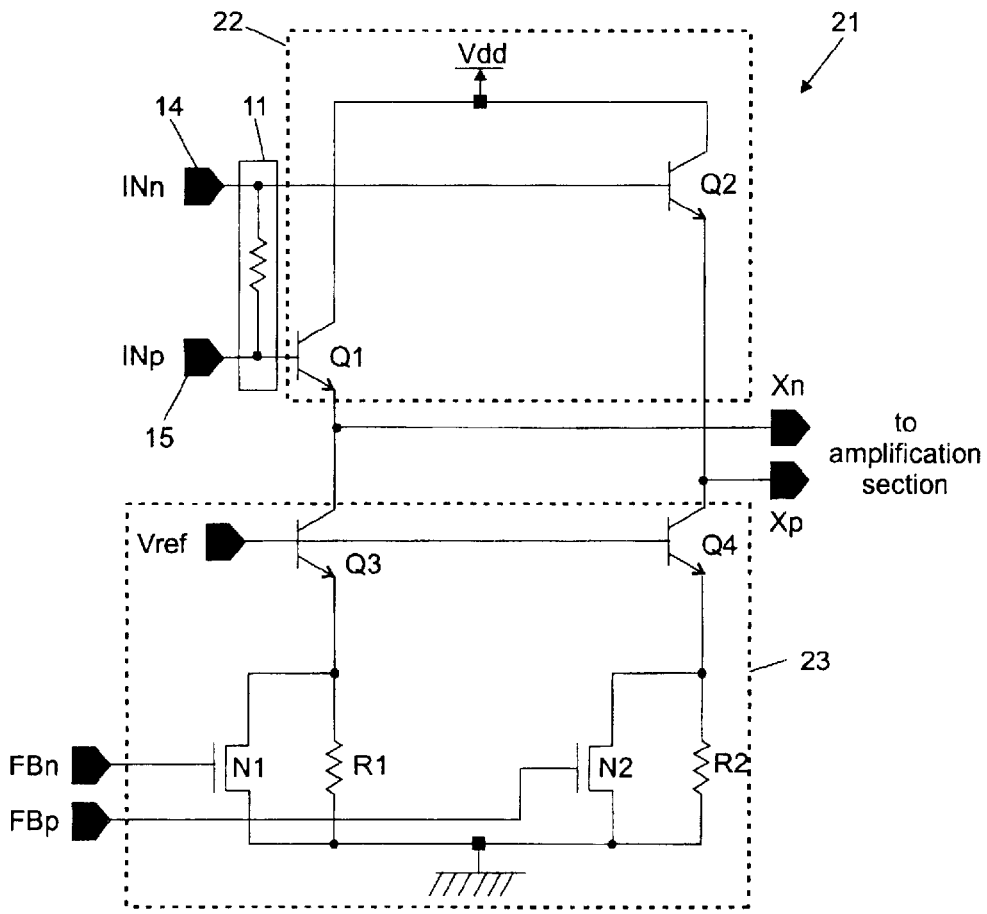
FIG. 4 shows a typical implementation of the innovative combining circuit of FIG. 2 in an advanced Bi-CMOS technology.

An example of a preferred hardware implementation of the combining block 21 of FIG. 2 in a Bipolar-CMOS technology is shown in FIG. 4, that clearly shows that circuits 22 and 23 can be advantageously merged in a single circuit. The single-ended input signals, i.e. INp and INn, drive the base of two bipolar transistors Q1 and Q2 mounted in emitter follower to form circuit 22, typically a buffer or an unitary gain amplifier. The bias current is provided by transistors Q3 and Q4 that are part of a conventional full current mirror stage (not detailed) with emitter resistors R1 and R2 to improve its efficiency. The base of transistors Q3 and Q4 is connected to a reference voltage Vref. The transistors Q3 and Q4 act as cascade transistors for the feedback signals. The feedback signals Fbn and Fbp drive the gate of two Nets N1 and N2 connected in parallel to R1 and R2 and working in their linear region (Vds<Vgs−Vt). Devices Q3, Q4, N1, N2, R1 and R2 form amplifier 23. Signals Xp and Xn that are generated by combining block 21 are applied to the summation nodes A' and B' at the input of the amplification section 12 (not shown).

Using standard notations, a complete small signal analysis of combining circuit 21 gives: V=Vin+K.Vfb, where Vfb= $V_{FBp}-V_{FBn}$ and K is equal to gmN/(gmB+1/Re), where gmN=Mu.Vds.Cox.W/L is the NFET transconductance, gmB=Ic/Ut is the bipolar transconductance and finally, Re is the emitter resistor (R1 or R2). K is thus a function of the width/length (W/L) ratio of the NFETs and can be adjusted independently to get the necessary amount of feedback to adjust the offset compensation without modifying the input matching circuit 11.

The advantages of this solution are recited below:
1. The DC offset signal is significantly reduced.
2. The feedback signal does not interfere with the input signal, maintaining thereby an excellent input impedance matching, i.e. parameter $S_{11}$ is close to an infinite negative value. This is mandatory in high speed systems to achieve a low eye-diagram closure or good jitter (and bit error rate) performance.

3. The efficiency of the offset compensation can be adjusted and is independent of input signal amplification.

4. The loop stability is ensured by construction.

5. All elements can be integrated in a semiconductor chip using conventional IC technologies (saving board space, element count and cost).

In short, the proposed solution ensures a significant offset reduction and thus improves the feedback efficiency. Moreover, it improves the input impedance matching (S parameter) on the whole tuning range but mainly at low frequencies.

Improved amplifier circuit 20 can be designed in any standard CMOS or bipolar technology. It has been implemented in a prototype of a post-amplifier chip in an advanced BiCMOS technology for 10 Gb/s Ethernet communications. The chip has been manufactured and tested. As far as amplifier 20 was concerned, results were in very good agreement with the performance predicted by the above simulations, as illustrated by Tables 1 and 2.

While the invention has been particularly described with respect to a preferred embodiment thereof it should be understood by one skilled in the art that the foregoing and other changes in form and details may be made therein without departing from the spirit and scope of the invention.

While the invention has been described in terms of specific embodiments, it is evident in view of the foregoing description that numerous alternatives, modifications and variations will be apparent to those skilled in the art. Thus, the invention is intended to encompass all such alternatives, modifications and variations will be apparent to those skilled in the art. Thus the invention is intended to encompass all such alternatives, modification and variations which fall within the scope and spirit of the invention and the appended claims.

What is claimed is:

1. An improved large bandwidth high frequency amplifier having a feedback loop comprising:

at least one input terminal, said input terminals supplying an input signal (Vin);

at least one output terminals, said output terminals supplying an amplified differential output signal (Vout) as a function of the input signal;

an input matching circuit;

a first isolation circuit;

an amplification section, wherein said input matching circuit, first isolation circuit and amplification section are connected in series in a direct amplification line, said amplification section having at least one large bandwidth low gain differential amplifier capable of generating said amplified output signal; and, a parallel feedback circuit consisting of a first feedback amplifier, an RC network, and a second isolation circuit connected in series, said parallel feedback circuit positioned between said output terminals and the amplification section inputs.

2. The improved amplifier of claim 1 wherein said first isolation circuit is selected from the group consisting of a buffer and an unitary gain amplifier.

3. The improved amplifier of claim 1 wherein said second isolation circuit is an amplifier having a gain >=1.

4. The improved amplifier of claim 2 wherein said second isolation circuit is an amplifier having a gain >=1.

* * * * *